(12) United States Patent
Kim et al.

(10) Patent No.: US 9,070,834 B2
(45) Date of Patent: Jun. 30, 2015

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jung Sung Kim, Seoul (KR); Yong Min Kim, Suwon-si (KR); Dong Myung Shin, Suwon-si (KR); Soo Jin Jung, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/261,124

(22) Filed: Apr. 24, 2014

(65) Prior Publication Data
US 2014/0367730 A1 Dec. 18, 2014

(30) Foreign Application Priority Data

Jun. 18, 2013 (KR) .................. 10-2013-0069962

(51) Int. Cl.
*H01L 29/88* (2006.01)
*H01L 29/861* (2006.01)
*H01L 33/38* (2010.01)

(52) U.S. Cl.
CPC .................... *H01L 33/38* (2013.01)

(58) Field of Classification Search
CPC ............ H01L 29/6603; H01L 29/6609; H01L 29/7817; H01L 29/66795
USPC ............. 257/722, 79, 104, 347, 613, 78, 101, 257/110, 410, 215, 216, 200, 201, 707, 631, 257/632, E21.006, E21.014, E21.126, 257/E21.127, E21.053, E21.145, E21.152, 257/E21.158, E21.17, E21.32, E21.267, 257/E21.352
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| 6,650,018 B1 * | 11/2003 | Zhao et al. | 257/775 |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |

(Continued)

FOREIGN PATENT DOCUMENTS

| | | |
|---|---|---|
| JP | 2012-009864 A | 1/2012 |
| JP | 2012-222219 A | 11/2012 |

(Continued)

*Primary Examiner* — David Nhu
(74) *Attorney, Agent, or Firm* — McDermott Will & Emery LLP

(57) ABSTRACT

A semiconductor light emitting device includes a light emitting structure, a first electrode unit, and a second electrode unit. The light emitting structure includes a first and second conductivity-type semiconductor layer, an active layer. The first electrode unit includes a first electrode pad and a first electrode finger extending from the first electrode pad, and having an annular shape with an open portion. The second electrode unit includes a second electrode pad and a second electrode finger extending from the second electrode pad, and has an annular shape with an open portion. One of the first and second electrode units substantially surrounds the other, and the center of the annular shape of at least one of the first and second electrode units is spaced apart from the center of the upper surface of the light emitting structure.

20 Claims, 15 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,188,505 B2 * | 5/2012 | Shen et al. .......... 257/99 |
| 8,212,276 B2 * | 7/2012 | Gong .................. 257/99 |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,872,204 B2 * | 10/2014 | Yang et al. ............ 257/98 |
| 2007/0228388 A1 | 10/2007 | Ko et al. |
| 2009/0159909 A1 | 6/2009 | Lee et al. |
| 2011/0156086 A1 | 6/2011 | Kim et al. |
| 2011/0278631 A1 | 11/2011 | Shen et al. |

FOREIGN PATENT DOCUMENTS

| | | |
|---|---|---|
| KR | 10-2011-0092082 A | 8/2011 |
| KR | 10-2012-0064494 A | 6/2012 |
| KR | 10-1179605 B1 | 9/2012 |

\* cited by examiner

SEMICONDUCTOR LIGHT EMITTING DEVICE

CROSS-REFERENCE TO RELATED APPLICATIONS

This application claims priority to, and benefit of, Korean Patent Application No. 10-2013-0069962 filed on Jun. 18, 2013, with the Korean Intellectual Property Office, the entire contents of which are hereby incorporated by reference.

TECHNICAL FIELD

The present disclosure relates to a semiconductor light emitting device.

BACKGROUND

Semiconductor light emitting devices emit light through the recombination of electrons and holes when a current is applied thereto and are commonly used as light sources due to various advantages thereof such as low power consumption, high levels of luminance, compactness, and the like. In particular, after the development of nitride light emitting devices, the utilization thereof has been greatly expanded and nitride light emitting devices are commonly employed as light sources in backlight units used for displays, general illumination devices, electrical systems, and the like. Various attempts have been made to improve the characteristics of semiconductor light emitting devices. In particular, a need exists for the development of an electrode structure improving luminance efficiency and lowering an operational voltage by evenly distributing (or spreading) currents within light emitting devices.

SUMMARY

An aspect of the present disclosure provides a semiconductor light emitting device having improved luminance efficiency and operational voltage characteristics.

However, objects of the present disclosure are not limited thereto and may include objects and effects that may be recognized from technical solutions or embodiments described hereinafter although not explicitly mentioned.

One aspect of the present disclosure relates to a semiconductor light emitting device including a light emitting structure, a first electrode unit and a second electrode unit. The light emitting structure includes a first conductivity-type semiconductor layer, an active layer, and a second conductivity-type semiconductor layer. The first electrode unit is disposed on an upper surface of the light emitting structure, connected to the first conductivity-type semiconductor layer, includes a first electrode pad and a first electrode finger extending from the first electrode pad, and has an annular shape with an open portion. The second electrode unit is disposed on the upper surface of the light emitting structure, connected to the second conductivity-type semiconductor layer, includes a second electrode pad and a second electrode finger extending from the second electrode pad, and has an annular shape with an open portion. One of the first and second electrode units substantially surrounds the other of the first and second electrode units, and the center of the annular shape of at least one of the first and second electrode units is spaced apart from the center of the upper surface of the light emitting structure.

At least one of the annular shapes of the first and second electrode units may correspond to the shape of the upper surface of light emitting structure.

The center of the annular shape of a particular one of the first and second electrode units may be spaced apart from the center of the upper surface of the light emitting structure in a direction of the electrode pad provided in the particular electrode unit being spaced apart from a vertex of the upper surface of the light emitting structure adjacent thereto.

The first electrode pad may be disposed in one of first sections divided by different diagonal lines linking vertices facing one another on the basis of the shape of the upper surface of the light emitting structure, and the second electrode pad may be disposed in a section among second sections, which does not overlap with the one first section, the second sections being divided by a horizontal line and a vertical line traversing the center of the upper surface of the light emitting structure on the basis of the upper surface of the light emitting structure.

On the basis of the shape of the upper surface of the light emitting structure, a distance between one side of the upper surface and an annular shape adjacent thereto and a distance between a side opposing the one side and the annular shape adjacent thereto may be different from each other.

The center of the annular shape of the first electrode unit may be spaced apart from the center of the annular shape of the second electrode unit.

A distance between one side of the annular shape of the one electrode unit substantially surrounding the other electrode unit, among the first and second electrode units, and one side of the annular shape of the other electrode unit adjacent thereto, may be different from a distance between another side opposing the one side of the annular shape of the one electrode unit and another side of the annular shape of the other electrode unit adjacent thereto.

At least one of the first and second electrode fingers may extend to the opened region of the annular shape to make the annular shape a closed loop.

The one electrode unit substantially surrounding the other electrode unit, among the first and second electrode units, may further include an auxiliary electrode finger extending through the opened region of the annular shape of the other electrode unit.

The auxiliary electrode finger may include a first auxiliary electrode finger extending toward the electrode pad provided in the other electrode unit.

The auxiliary electrode finger may further include a second auxiliary electrode finger extending in a direction different from the direction in which the first auxiliary electrode finger extends.

A distance between one side of the annular shape of the other electrode unit and the first auxiliary electrode finger and a distance between the other side opposing the one side of the annular shape of the other electrode unit and the second auxiliary electrode finger may be different from each other.

The other electrode unit may further include an intermediate electrode finger extending between the first and second auxiliary electrode fingers.

A distance between the first auxiliary electrode finger and the intermediate electrode finger and a distance between the second auxiliary electrode finger and the intermediate electrode finger may be different from each other.

Another aspect of the present disclosure encompasses a semiconductor light emitting device including a light emitting structure, a first electrode unit, and a second electrode unit. The light emitting structure includes a first conductivity-type semiconductor layer, an active layer, and a second conductivity-type semiconductor layer, and having an upper surface with first to fourth sides. The first electrode unit is disposed on an upper surface of the light emitting structure, connected to the first conductivity-type semiconductor layer, and includes a first electrode pad and a first electrode finger extending from the first electrode pad. The second electrode unit is disposed on the upper surface of the light emitting structure, connected to the second conductivity-type semiconductor layer, and includes a second electrode pad and a second electrode finger extending from the second electrode pad. The first and second electrode units have an annular shape with an open portion, one of the first and second electrode units substantially surrounds the other of the first and second electrode units, and a distance between a first side of the upper surface of the light emitting structure and an annular shape adjacent thereto and a distance between a second side opposing the first side and an annular shape adjacent thereto are different.

Still another aspect of the present disclosure relates to a semiconductor light emitting device including a light emitting structure, a first electrode unit and a second electrode unit. The light emitting structure includes a first conductivity-type semiconductor layer, an active layer, and a second conductivity-type semiconductor layer. The first electrode unit is disposed on an upper surface of the light emitting structure, connected to the first conductivity-type semiconductor layer, includes a first electrode pad and a first electrode finger extending from the first electrode pad, and has an annular shape with an open portion. The second electrode unit is disposed on the upper surface of the light emitting structure, connected to the second conductivity-type semiconductor layer, includes a second electrode pad and a second electrode finger extending from the second electrode pad, and has an annular shape that has a closed loop. One of the first and second electrode units substantially surrounds the other of the first and second electrode units, and the center of the annular shape of at least one of the first and second electrode units is spaced apart from the center of the upper surface of the light emitting structure.

The one electrode unit substantially surrounding the other electrode unit, among the first and second electrode units, may further include an auxiliary electrode finger extending through the opened region of the annular shape of the other electrode unit.

The auxiliary electrode finger may include a first auxiliary electrode finger extending toward the electrode pad provided in the other electrode unit.

The auxiliary electrode finger may further include a second auxiliary electrode finger extending in a direction different from the direction in which the first auxiliary electrode finger extends.

A distance between one side of the annular shape of the other electrode unit and the first auxiliary electrode finger and a distance between the other side opposing the one side of the annular shape of the other electrode unit and the second auxiliary electrode finger may be different from each other.

The other electrode unit may further include an intermediate electrode finger extending between the first and second auxiliary electrode fingers.

The foregoing technical solutions do not fully enumerate all of the features of the present disclosure. The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

The above and other aspects, features and other advantages of the present inventive concept will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
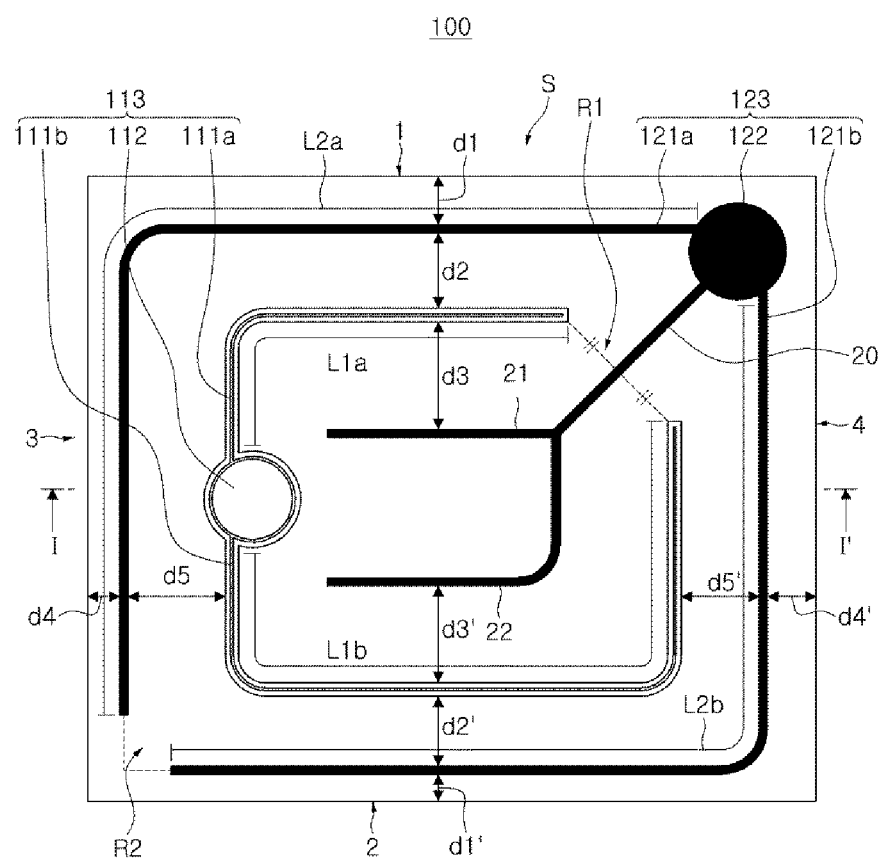
FIG. 1 is a schematic plan view of a semiconductor light emitting device according to an embodiment of the present inventive concept.

Hereinafter, embodiments of the present inventive concept will be described in detail with reference to the accompanying drawings.

The inventive concept may, however, be embodied in many different forms and should not be construed as being limited to the embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like components.

Figure 2:
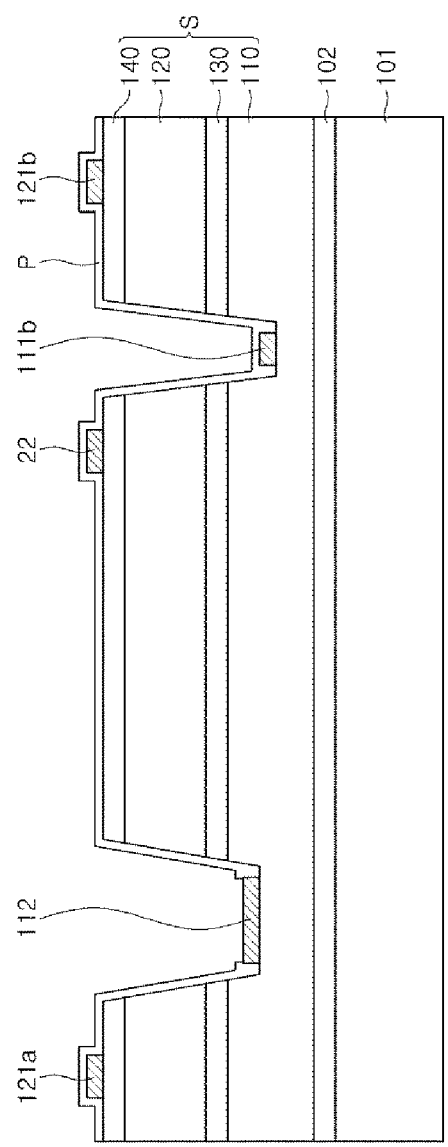
FIG. 2 is a cross-sectional view schematically illustrating the semiconductor light emitting device taken along line I-I' of FIG. 1.

FIG. 1 is a schematic plan view of a semiconductor light emitting device 100 according to an embodiment of the present inventive concept. FIG. 2 is a cross-sectional view schematically illustrating the semiconductor light emitting device 100 taken along line I-I' of FIG. 1.

Referring to FIGS. 1 and 2, the semiconductor light emitting device 100 according to an embodiment of the present inventive concept may include a buffer layer 102 and a light emitting structure S disposed on a substrate 101. The light emitting structure may include a first conductivity-type semiconductor layer 110, an active layer 130, and a second conductivity-type semiconductor layer 120. Also, the semiconductor light emitting device 100 according to an embodiment of the present inventive concept may include first and second electrode units 113 and 123 connected to the first and second conductivity-type semiconductor layers 110 and 120 and applying driving power thereto, respectively.

Meanwhile, terms such as 'top', 'upper portion', 'upper surface', 'bottom', 'lower portion', 'lower surface', 'lateral surface', and the like, are based on drawings, and may differ according to a direction in which a device or a package is placed in actuality.

The substrate 101 may be provided as a semiconductor growth substrate and may be formed of an insulating, conductive, or semiconductive material such as sapphire, silicon (Si), SiC, $MgAl_2O_4$, MgO, $LiAlO_2$, $LiGaO_2$, GaN, and the like. Sapphire, commonly used as a material of a nitride semiconductor growth substrate, is a crystal having electrical insulating properties and having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane allows a nitride thin film to be relatively easily grown thereon and is stable at high temperatures, so sapphire is commonly used as a nitride growth substrate.

Also, another material appropriate to be used as a material of the substrate 101 may be silicon (Si). Since a silicon (Si) substrate may have a large diameter and may be relatively low in price, employment of such a silicon substrate may lead to enhanced mass-production. In the case of using a silicon (Si) substrate, a nucleation layer formed of a material such as $Al_xGa_{1-x}N$ may be formed on a substrate and a nitride semiconductor having a desired structure may be grown on the nucleation layer.

Meanwhile, although not shown, a plurality of concavo-convex structures may be formed on an upper surface of the substrate 101, e.g., on a surface on which semiconductor layers are grown, and crystallinity and light emission efficiency of the semiconductor layers may be enhanced due to the concavo-convex structures.

Referring to FIG. 2, the buffer layer 102, serving to mitigate a lattice defect in the light emitting structure S grown on the substrate 101, may be formed as an undoped semiconductor layer formed of a nitride, or the like. For example, the buffer layer 102 may mitigate a difference in lattice constants between the sapphire substrate 101 and the first conductivity-type semiconductor layer 110 formed of GaN and laminated thereon to increase crystallinity of the GaN layer.

As a material used to form the buffer layer 102, for example, $Al_xIn_yGa_{1-x-y}N$ (0≤x≤1, 0≤y≤1), in particular, undoped GaN, AlN, InGaN, or the like, may be applied, and the buffer layer 102 may be grown to have a thickness ranging from tens to hundreds of Å at a low temperature ranging from 500° C. to 600° C. Here, the term undoped refers to a semiconductor layer which has not been subjected to an impurity doping process, and the semiconductor layer may have an inherent level of impurity concentration. For example, when a gallium nitride semiconductor is grown using metal organic chemical vapor deposition (MOCVD), silicon (Si), or the like, used as a dopant, may be included in an amount ranging from about $10^{14}$ to $10^{18}/cm^3$ therein. Of course, the present inventive concept is not limited thereto and any structure may be employed as long as it can enhance crystallinity of the light emitting structure S, and materials such as $ZrB_2$, $HfB_2$, ZrN, HfN, TiN, ZnO, and the like, may also be used. Also, the buffer layer 102 may be formed by combining a plurality of layers or by gradually changing a composition therein. The buffer layer 102 is not an essential element, which may be omitted according to an embodiment of the present inventive concept.

The light emitting structure S may include the first conductivity-type semiconductor layer 110, the active layer 130, and the second conductivity-type semiconductor layer 120 sequentially disposed on the substrate 101. The first and second conductivity-type semiconductor layers 110 and 120 may be formed of n-type and p-type impurity-doped semiconductors, respectively. However, the present inventive concept is not limited thereto, and, conversely, the first and second conductivity-type semiconductor layers 110 and 120 may be formed of p-type and n-type impurity-doped semiconductors, respectively. Also, the first and second conductivity-type semiconductor layers 110 and 120 may be formed of a nitride semiconductor, e.g., a material having a composition of $Al_xIn_yGa_{1-x-y}N$ (0≤x≤1, 0≤y≤1, 0≤x+y≤1). Besides, the first and second conductivity-type semiconductor layers 110 and 120 may also be formed of a material such as an AlGaInP-based semiconductor or an AlGaAs-based semiconductor.

The active layer 130 may be disposed between the first conductivity-type semiconductor layer 110 and the second conductivity-type semiconductor layer 120 and may emit light having a predetermined level of energy according to electron-hole recombination. The active layer 130 may include a material having an energy band gap smaller than energy band gaps of the first and second conductivity-type semiconductor layers 110 and 120. For example, when the first and second conductivity-type semiconductor layers 110 and 120 include a GaN-based compound semiconductor, the active layer 130 may include an InAlGaN-based compound semiconductor having an energy band gap smaller than an energy band gap of GaN. Also, the active layer 130 may have a multi-quantum well (MQW) structure in which a quantum well layer and a quantum barrier layer are alternately laminated. For example, an InGaN/GaN structure may be used.

The first and second conductivity-type semiconductor layers 110 and 120 and the active layer 130 may be grown by using a semiconductor growth process such as metal-organic chemical vapor deposition (MOCVD), molecular beam epitaxy (MBE), hydride vapor phase epitaxy (HVPE), or the like.

Referring to FIG. 1, the first or second electrode units 113 and 123, serving to electrically connect the first and second conductivity-type semiconductor layers 110 and 120 to the outside, may be connected to the first and second conductivity-type semiconductor layers 110 and 120. The first and second electrode units 113 and 123 may be formed of a material selected from silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), and the like, and may be formed through a process such as deposition, sputtering, plating, or the like, respectively. Also, the first and second electrode units 113 and 123 may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. However, the present inventive concept is not limited thereto and any material may be used to form the first and second electrode units 113 and 123 as long as it has conductivity.

In an embodiment of the present inventive concept, the first and second electrode units 113 and 123 may be disposed on the light emitting structure S. For example, when the first conductivity-type semiconductor layer 110 is an n-type semiconductor layer and the second conductivity-type semiconductor layer 120 is a p-type semiconductor layer, the first electrode unit 113 may be disposed on the first conductivity-type semiconductor layer 110 exposed as the light emitting structure S is mesa-etched to be exposed, and the second electrode unit 123 may be disposed on the second conductivity-type semiconductor layer 120. Here, a transparent electrode layer 140 may be disposed between the second conductivity-type semiconductor layer 120 and the second electrode unit 123. The transparent electrode layer 140 may be formed of a transparent conductive oxide layer having relatively excellent ohmic-contact performance while having a high level of light transmittance, and may be formed as at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, or zinc magnesium oxide $(Zn_{1-x}Mg_xO)$ $(0 \leq x \leq 1)$.

A passivation layer P may be formed on an upper surface of the semiconductor light emitting device 100 in which the first electrode unit 113 and the second electrode unit 123 are formed. The passivation layer P may be formed to cover the entire surface of the device, excluding only an electrode pad region. The passivation layer P may serve to prevent a generation of an electrical short circuit in an undesired portion, as well as protecting the active layer 130 from an ambient environment. The passivation layer P may be formed of at least one of silicon oxide ($SiO_2$), silicon nitride ($Si_xN_y$), and silicon oxynitride ($SiO_xN_y$).

In an embodiment of the present inventive concept, the first electrode unit 113 may include a first electrode pad 112 in contact with a conductive wire, a solder pump, and the like, and at least one of first electrode fingers 111a and 111b extending from the first electrode pad 112. The second electrode unit 123 may include a second electrode pad 122 in contact with a conductive wire, a solder pump, and the like, and at least one of second electrode fingers 121a and 121b extending from the second electrode pad 122. In an embodiment of the present inventive concept, the semiconductor light emitting device 100 having luminance efficiency and operational voltage characteristics improved by appropriately designing the electrode units is proposed. Details thereof will be described with reference to FIGS. 1, 3A, 3B, and 4.

Figure 3:
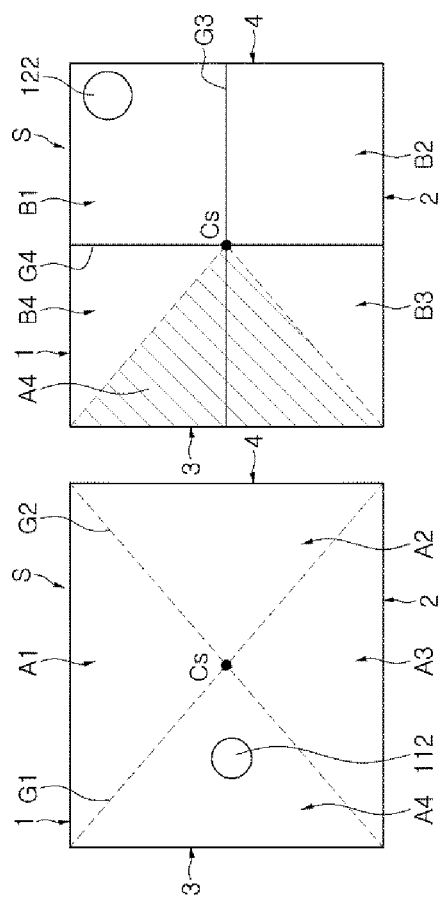
FIGS. 3A and 3B are plan views schematically illustrating only an upper surface of the light emitting structure and illustrating first and second electrode pads of FIG. 1, respectively.
Figure 4:
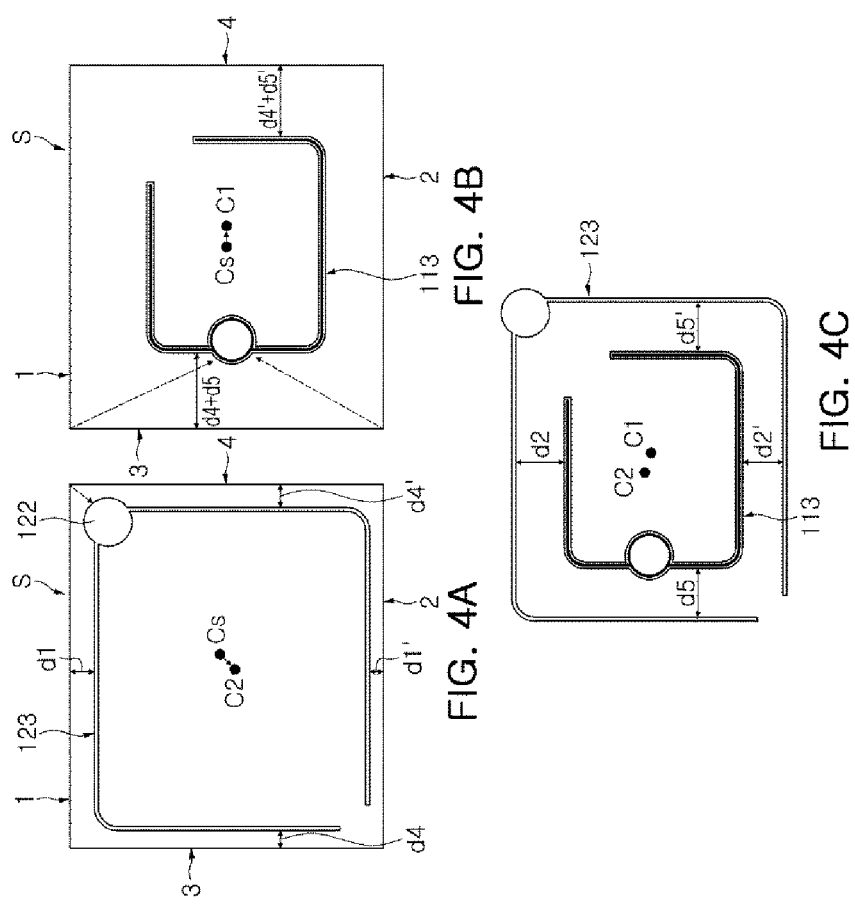
FIGS. 4A and 4B are plan views schematically illustrating only an upper surface of the light emitting structure and illustrating first and second electrode units of FIG. 1, respectively.
FIG. 4C is a plan view schematically illustrating only the first and second electrode units of FIG. 1.

FIGS. 3A and 3B are plan views schematically illustrating only an upper surface of the light emitting structure S and illustrating the first and second electrode pads 112 and 122 of FIG. 1, respectively.

The first and second electrode pads 112 and 122 according to an embodiment of the present inventive concept may be asymmetrically disposed on an upper surface of the light emitting structure S, but the present inventive concept is not limited thereto. Here, 'asymmetrical disposition' refers to a case in which positions of the first and second electrode pads 112 and 122 are not symmetrical with respect to diagonal lines G1 and G2, a horizontal line G3, and a vertical line G4 traversing the center Cs of the light emitting structure S.

For example, as illustrated in FIG. 3A, the first electrode pad 112 according to an embodiment of the present inventive concept may be disposed within a section A4 among first sections A1, A2, A3, and A4 divided by the different diagonal lines G1 and G2 that link vertices facing one another on the upper surface of the light emitting structure S. Also, as illustrated in FIG. 3B, among second sections B1, B2, B3, and B4 divided by a horizontal line G3 and a vertical line G4 that traverse the center Cs of the upper surface of the light emitting structure S on the upper surface of the light emitting structure S, the second electrode pad 122 may be disposed in either of the sections B1 and B2, excluding sections, e.g., B3 and B4, overlapping with the section A4 among the first sections in which the first electrode pad 112 is disposed. As illustrated in FIG. 3B, the second electrode pad 122 is disposed in the section B1.

Meanwhile, the sections in which the first and second electrode pads 112 and 122 are formed may be regions which are most closely in contact with external power, and thus, currents are concentrated thereon. In general, in order to increase luminance efficiency of the light emitting device, it is important to evenly distribute currents, applied to the light emitting device, within the light emitting structure S. In this case, a structure in which the first and second electrode pads 112 and 122 are disposed to be farthest away from one another within the light emitting structure S may be considered. For example, a structure in which the first and second electrode pads 112 and 122 are disposed at both ends of the diagonal lines traversing the center the upper surface of the light emitting structure S on the upper surface thereof, or a structure in which the first and second electrode pads 112 and 122 are disposed at both ends of the horizontal line or the vertical line traversing the center of the upper surface of the light emitting structure S may be considered. However, according to such dispositions of electrode pads, a degree of freedom of design of the electrodes is limited in determining positions of the first and second electrode pads 112 and 122, and as the first and second electrode pads 112 and 122 are away farther from one other, a magnitude of a voltage required for driving the light emitting device is increased, degrading the operational voltage characteristics.

Meanwhile, according to an embodiment of the present inventive concept, as described above, it is not necessary for the first and second electrode pads 112 and 122 to be disposed symmetrically on the basis of the shape of the upper surface of the light emitting structure S and a degree of freedom of design electrodes can be sufficiently guaranteed. Also, in comparison to the case in which the first and second electrode pads 112 and 122 are disposed at both ends of the diagonal line G1 or G2 traversing the center of the upper surface of the light emitting structure S, a distance between the first and second electrode pads 112 and 122 can be reduced, improving operational voltage characteristics of the light emitting device.

Meanwhile, as the first and second electrode pads 112 and 122 are disposed to be closer, it may be disadvantageous to an even current distribution within the light emitting device S. Thus, the first and second electrode pads 112 and 122 may be disposed asymmetrically, namely, the first and second electrode pads 112 and 122 may be disposed to satisfy the conditions related to the first and second sections as described above, but such that they are positioned as distantly from one another as possible. In addition, current concentration on a particular portion occurring according to asymmetrical dispositions of the first and second electrode pads 112 and 122 may be resolved through asymmetrical dispositions of the first electrode fingers 111a and 111b and the second fingers 121a and 121b. Details thereof will be described with reference to FIGS. 1 and 4.

First, referring to FIG. 1, the first electrode unit 113 may include the two first electrodes 111a and 111b extending from the first electrode pad 112. For example, the two first electrodes 111a and 111b may extend from the first electrode pad 112 such that the first electrode unit 113 has an annular shape.

In this case, the annular shapes of the first second electrode unit 113 may be symmetrical on the basis of at least one of the horizontal line, vertical line, and diagonal lines traversing the center of the first electrode unit 113 having the annular shape. Herein, for example, the center of the annular shape may refer to a center of gravity of an imaginary figure defined by the perimeter of the annular shape. Similarly, the annular shape of the second electrode unit 123 may be symmetrical on the basis of at least one of the horizontal line, vertical line, and diagonal lines traversing the center of the second electrode unit 123 having the annular shape. However, the present inventive concept is not limited thereto.

Meanwhile, the two first electrode fingers 111a and 111b may be formed so as not to be in contact with each other, and accordingly, the first electrode unit 113 may have an annular shape with an open portion a region. Similarly, the second electrode unit 123 may include two second electrode fingers 121a and 121b extending from the second electrode pad 122, and the two second electrode fingers 121a and 121b may extend from the second electrode pad 122 such that the second electrode unit 123 has a partially opened annular shape.

The two first electrode fingers 111a and 111b may have different lengths (L1a≠L1b is satisfied), and the two second electrode filters 121a and 121b may have different lengths (L2a≠L2b is satisfied). However, the present inventive concept is not limited thereto and the first and second electrode fingers 121a and 121b may be formed to have the same length.

The opened region of the annular shape of one electrode unit (e.g., the first electrode unit 113) may be a region (e.g., R1) adjacent to an electrode pad (e.g., the second electrode pad 122) provided in a different electrode unit (e.g., the second electrode unit 123), as illustrated in FIG. 1. Since current concentration may occur in the region adjacent to the second electrode pad 122, the first electrode fingers 111a and 111b may not be disposed for even current distribution (or even current spreading).

Also, a region R2 positioned farthest from an electrode pad (e.g., the second electrode pad 122 interposed in the same electrode unit like the second electrode unit 123 may be formed to be opened. In detail, for example, the region R2 of the second electrode unit 123 having an opened annular shape may be symmetrical with the region in which the second electrode pad 122 is positioned with respect to the center C2 (please see the annular shape of FIG. 4A). This is because an effect of the second electrode fingers 121a and 121b contributing to current distribution is reduced away from the second electrode pad 122, and thus, the region R2 may be formed as being opened to thus prevent a degradation of luminance efficiency as otherwise the second electrode fingers 121a and 121b cover the upper surface of the light emitting structure S.

The annular shapes of the first and second electrode units 113 and 123 are illustrated as substantially corresponding (e.g., a quadrangular annular shape) to the shape of the upper surface of the light emitting structure S, but the present inventive concept is not limited thereto and the annular shapes of the first and second electrode units 113 and 123 may be circular or oval. Also, the annular shape of the first electrode unit 113 and the annular shape of the second electrode unit 123 may be different.

In an embodiment of the present inventive concept, the first and second electrode units 113 and 123 may be formed such that one of them substantially surrounds the other. Here, 'substantially surrounding' means that, when a virtual extending line is drawn from end portions of the electrode fingers in the opened regions of the annular shapes of the electrode units, another electrode unit is captured within a closed internal region defined by the extending line and the annular shape.

For example, in the case of the embodiment illustrated in FIG. 1, the second electrode unit 123 has an annular shape having the opened region R2 formed in end portions of the two extending second electrode fingers 121a and 121b, and when extending lines are drawn from the respective end portions of the two second electrode fingers 121a and 121b, the first electrode unit 113 is captured within the closed internal region defined by the extending lines (indicated by the alternate long and short dashed line) and the annular shape.

In this case, since one of the first and second electrode units substantially captures the other, currents can be evenly spread within the light emitting structure S.

Also, when any one electrode unit (e.g., the second electrode unit 123 in the embodiment of FIG. 1) surrounding the other is provided as an n-type electrode unit connected to an n-type semiconductor layer, the outermost region of the light emitting structure S may be set as a mesa etching region for disposing the n-type electrode unit, advantageously minimizing the mesa etching region and increasing an area of the active layer 130.

In an embodiment of the present inventive concept, at least one of the first and second electrode units 113 and 123 having the annular shapes may be formed such that the center thereof is spaced apart from the center of the upper surface of the light emitting structure S. Details thereof will be described with reference to FIGS. 1 and 4.

FIGS. 4A and 4B are plan view schematically illustrating only the upper surface of the light emitting structure S and illustrating first and second electrode units 113 and 123 of FIG. 1, respectively.

First, referring to FIG. 4A, the center C2 of the second electrode unit 123 having the annular shape may be formed to be spaced apart from the center Cs of the upper surface of the light emitting structure S by a predetermined interval. Accordingly, on the basis of the shape of the upper surface of the light emitting structure S, a distance d1 between a first side 1 of the upper surface and the annular shape adjacent thereto and a distance d1' between a second side 2 opposing the first side 1 and the annular shape adjacent thereto are different. Similarly, a distance d4 between a third side 3 of the upper surface and the annular shape adjacent thereto and a distance d4' between a fourth side 4 opposing the third side and the annular shape adjacent thereto may be different (d1≠d1' and d4≠d4' are satisfied). The distances d1, d1', d4, and d4' may be determined as being within 50 μm, but the present inventive concept is not limited thereto.

This is intended in consideration of current concentration on the electrode pad, and as illustrated in FIG. 4A, the center C2 of the second electrode unit 123 having the annular shape may be spaced apart from the center Cs of the upper surface of the light emitting structure S in a direction (as indicated by the arrow) in which the second electrode pad 122 provided in the second electrode unit 123 becomes distant from the vertex of the upper surface of the light emitting structure S adjacent thereto.

For example, as illustrated, when the second electrode pad 122 is positioned in a right upper portion on the light emitting structure S, currents may be concentrated upwardly. Thus, the distances d1 and d4' between the one sides 1 and 4 of the light emitting structure S and the annular shapes adjacent thereto may be adjusted to be greater, while the distances d1' and d4 between the one sides 2 and 3 of the light emitting structure S and the annular shapes adjacent thereto in the left lower region may be adjusted to be smaller. Accordingly, low current density therein may be compensated, promoting even current spreading (d1>d1' and d4'>d4 are satisfied).

Meanwhile, the electrode unit formed such that the center thereof is spaced apart from the center Cs of the upper surface of the light emitting structure S is not limited to the second electrode unit 123. Thus, as illustrated in FIG. 4B, the center C1 of the first electrode unit 113 having the annular shape may be spaced apart from the center Cs of the upper surface of the light emitting structure S by a predetermined interval.

Also, similar to the example described with reference to FIG. 4A, the center C1 of the first electrode unit 113 having the annular shape may be spaced apart from the center Cs of the upper surface of the light emitting structure S such that the first electrode pad 112 provided in the first electrode unit 113 becomes distant from the vertex of the upper surface of the light emitting structure S adjacent thereto. In this case, on the basis of the shape of the upper surface of the light emitting structure S, the distance d4+d5 between the third side 3 of the upper surface and the annular shape adjacent thereto and the distance d4'+d5' between the fourth side 4 and the annular shape adjacent thereto may be different (d4+d5≠d4'+d5' is satisfied).

In particular, as illustrated, since the first electrode pad 112 is inclined to the left on the basis of the shape of the upper surface of the light emitting structure S, the distances d4+d5 between the left side 3 and the annular shape adjacent thereto may be greater than the distance d4'+d5' between the right side 4 and the annular shape adjacent thereto (d4+d5>d4'+d5' is satisfied).

FIG. 4C is a plan view schematically illustrating only the first and second electrode units 113 and 123 of FIG. 1.

As illustrated in FIG. 4C, the center C1 of the first electrode unit 113 having the annular shape according to an embodiment of the present inventive concept may be spaced apart from the center C2 of the second electrode unit 123 having the annular shape, but the present inventive concept is not limited thereto.

In this case, a distance between one side of one electrode unit substantially surrounding the other electrode unit and one side of the other electrode unit adjacent thereto may be different from a distance between the other side of the one electrode unit opposing the one side thereof and the other side of the other electrode unit adjacent thereto. For example, referring to FIG. 4C, a distance d2 or d5 between one side of the second electrode unit 123 substantially surrounding the first electrode unit 113 and one side of the first electrode unit 113 adjacent thereto, may be different from a distance d2' or d5' between the other side opposing the one side of the second electrode unit 123 having the annular shape and the other side of the first electrode unit 113 having the annular shape adjacent thereto (d2≠d2' and d5≠d5' are satisfied). The differences between d2 and d2' and between d5 and d5' may be determined within 50 μm, but the present inventive concept is not limited thereto.

As a result, in the embodiments of FIGS. 4A through 4C, it may be understood that the first electrode fingers 111a and 111b formed on the upper surface of the light emitting structure S are formed to be asymmetrical with respect to the shape of the upper surface of the light emitting structure S, respectively, and the first electrode fingers 111a and 111b are formed to be asymmetrical to each other. Similarly, it may be understood that the second electrode fingers 121a and 121b formed on the upper surface of the light emitting structure S are formed to be asymmetrical with respect to the shape of the upper surface of the light emitting structure S, respectively, and the second electrode fingers 121a and 121b are formed to be asymmetrical to each other.

Thus, the first fingers 111a and 111b are asymmetrically formed and the second electrode fingers 121a and 121b are asymmetrically formed such that the annular shapes of the first and second electrode units 113 and 123 satisfy at least one of conditions of d1≠d1', d2≠d2', d4≠d4', and d5≠d5'. Therefore, an electrode structure allowing for even current spreading can be implemented although the first and second electrode pads 112 and 122 are asymmetrically disposed as described above.

Meanwhile, on the basis of the annular shape of one electrode unit substantially surrounding the other electrode unit, among the first and second electrode units 113 and 123, and the upper surface of the light emitting structure S, a distance between one of sides of the upper surface and the annular shape of the one electrode unit may be smaller than a distance between the annular shape of the one electrode unit and the annular shape of the other electrode unit.

For example, referring to FIGS. 4A to 4C, on the basis of the annular shape of the second electrode unit 123 substantially surrounding the first electrode unit 113 and the upper surface of the light emitting structure S, the distances d1, d1', d4, and d4' between one sides 1, 2, 3, and 4 and the annular shape of the second electrode unit 123 may be smaller than the distances d2, d2', d5, and d5' between the annular shape of the second electrode unit 123 and the annular shape of the first electrode unit 113 (namely, d1<d2, d1'<d2', d4<d5, and d4'<d5' are satisfied). It may be understood that the distances between two electrode fingers among the first and second electrode fingers 111a, 111b, 121a and 121b are smaller in the outer region of the light emitting structure S than in the central region thereof.

In this manner, when the distance between two electrode fingers among the electrode fingers is narrower toward the outer edges of the light emitting structure S, currents may be widely distributed or spread to the outer region of the light emitting structure S, rather than being concentrated on the central region thereof, and light emission can be effectively induced in the outer regions of the light emitting structure S having a large circumference, and thus, luminance efficiency and operational voltage characteristics can be effectively improved.

Hereinafter, another configuration of an embodiment of the present inventive concept will be described in detail with reference back to FIG. 1.

In an embodiment of the present inventive concept, among the first and second electrode units 113 and 123, one electrode unit substantially surrounding the other may further include an auxiliary electrode finger 20 extending through the opened region of the annular shapes of the other electrode unit. For example, as illustrated in FIG. 1, the second electrode unit 123 substantially surrounding the first electrode unit 113 may further include the auxiliary electrode finger 20 extending through the opened region R1 of the annular shape of the first electrode unit 113.

In this case, since the second electrode unit 123 is disposed even in the internal region of the annular shape of the first electrode unit 113, currents can be evenly spread even in the region adjacent to the center of the light emitting structure S, as well as in the region adjacent to the outer edge of the light emitting structure S. The auxiliary electrode finger 20 may extend in a direction in which the line segment (indicated by the dotted line in the region R1 in FIG. 1) linking both end portions of the opened region of the annular shape of the first electrode fingers 111a and 111b by a straight line is bisected, but the present inventive concept is not limited thereto.

In an embodiment of the present inventive concept, the auxiliary electrode finger 20 may include a first auxiliary electrode finger 21 extending toward the first electrode pad 112 provided in the first electrode unit 113. Also, the auxiliary electrode finger 20 may further include a second auxiliary electrode finger 22 extending in a direction different from the direction in which the first auxiliary electrode finger 21 extends. The auxiliary electrode finger may have a bent shape. At least one of the first auxiliary electrode finger 21 and the second auxiliary electrode finger 22 may have a bent shape. In the case of the embodiment illustrated in FIG. 1, the second auxiliary electrode finger extends from the auxiliary electrode finger 20 in a direction different from that of the first auxiliary electrode finger 21 and having a bent shape to have an end portion facing the first electrode pad 112.

Meanwhile, asymmetry of the electrode fingers as described above may also be applied to the formation positions of the first and second auxiliary electrode fingers 21 and 22. In detail, a distance d3 between one side of the annular shape of the first electrode unit 113 and the first auxiliary electrode finger 21 may be different from a distance d3' between the other side of the annular shape of the first electrode unit 113 opposing the one side thereof and the second auxiliary electrode finger 22 may be different (d3≠d3' is satisfied).

In the case of the embodiment illustrated in FIG. 1, the distance d3 between the first auxiliary electrode finger adjacent to an upper region of the light emitting structure S in which the electrode pad is disposed to be relatively adjacent and the one side of the annular shape of the first electrode unit 113 may be greater than the distance d3' between the other side of the annular shape of the first electrode unit 113 and the second auxiliary electrode finger 22 (d3>d3' is satisfied). Due to such asymmetry between the electrode fingers, currents may be more evenly spread within the light emitting structure S.

Also, in order to allow currents to be more widely spread to the outer regions of the light emitting structure S, rather than being concentrated on the central region thereof, the distance d3 between the first auxiliary electrode finger 21 and the first electrode finger 111a may be greater than the distance d2 between the first electrode finger 111a and the second electrode finger 121a adjacent thereto (namely, d3>d2 is satisfied). Similarly, the distance d3' between the second auxiliary electrode finger 22 and the first electrode finger 111b may be greater than the distance d2' between the first electrode finger 111b and the second electrode finger 121b adjacent thereto (namely, d3'>d2' is satisfied).

According to an embodiment of the present inventive concept, since the first and second electrode fingers 111a, 111b, 121a and 121b are designed as being asymmetrical, although the first and second pads 112 and 122 are asymmetrically disposed, an even current spreading effect can be obtained. Also, since the first and second electrode pads 112 and 122 are asymmetrically disposed, the operational power characteristics of the semiconductor light emitting device 100 can be improved. In addition, one of the first and second electrode units 113 and 123 may be configured to substantially surround the other of the first and second electrode units 113 and 123 and distances between the respective electrode fingers of the first and second electrode units 113 and 123 are adjusted to allow currents to be widely spread to the outer regions of the light emitting structure S, rather than being concentrated on the central region thereof.

Hereinafter, a semiconductor light emitting device 200 according to a modification of the present inventive concept will be described with reference to FIG. 5.

Figure 5:
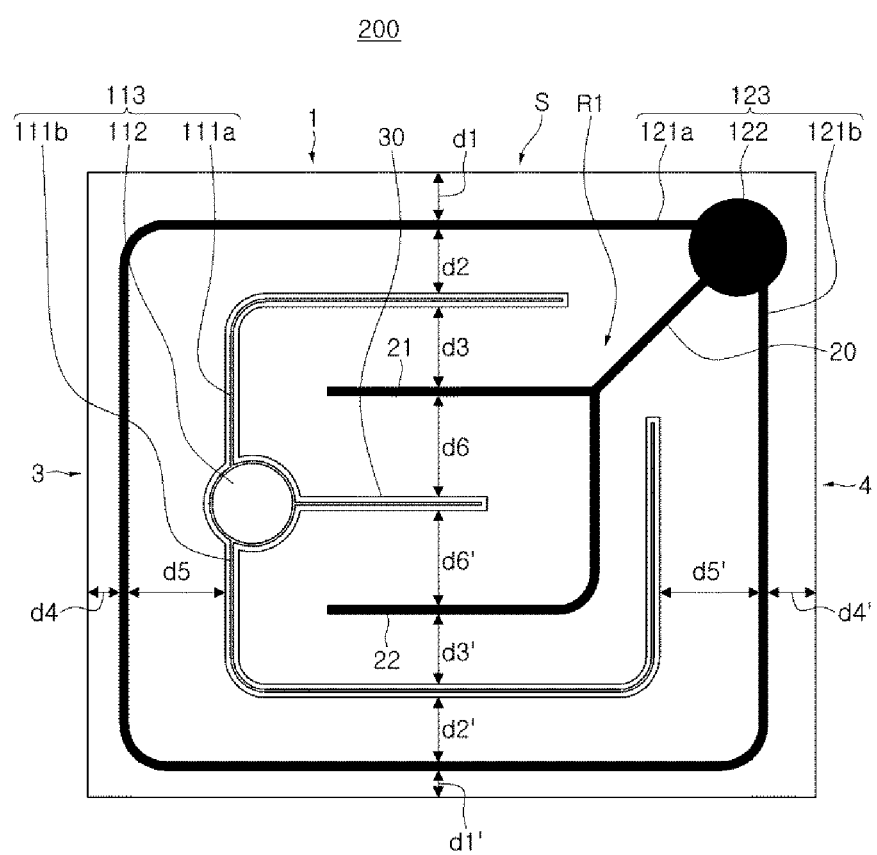
FIGS. 5 and 6 each are schematic plan views of a semiconductor light emitting device according to an embodiment of the present inventive concept.

FIG. 5 is a schematic plan view of the semiconductor light emitting device 200 according to an embodiment of the present inventive concept. FIG. 5 illustrates a modification of FIG. 1.

Referring to FIG. 5, the semiconductor light emitting device 200 according to an embodiment of the present inventive concept may include the light emitting structure S and the first and second electrode units 113 and 123. The light emitting structure S may include the first conductivity-type semiconductor layer 110, the active layer 130, and the second conductivity-type semiconductor layer 120. The first electrode unit 113 may connected to the first conductivity-type semiconductor layer 110, and the second electrode unit 123 may connected to the second conductivity-type semiconductor layer 120. The first electrode unit 113 may include the first electrode pad 112 and the first electrode fingers 111a and 111b. The second electrode unit 123 may include the second electrode pad 122 and the second electrode fingers 121a and 121b.

Hereinafter, detailed descriptions of elements the same as those of the above-described embodiments will be omitted and different elements will be mainly described to clarify the gist of an embodiment of the present inventive concept.

In an embodiment of the present inventive concept, the second electrode unit 123 may be formed to substantially surround the first electrode unit 113. Here, unlike the embodiment of FIG. 1, the two second electrode fingers 121a and 121b of the second electrode unit 123 may extend to the opened region of the annular shape to form a closed loop. In this case, since the second electrode unit 123 completely surrounds the first electrode unit 113, currents can be more smoothly spread.

In an embodiment of the present inventive concept, the second electrode unit 123 may include the auxiliary electrode finger 20 extending through the opened region R1 of the annular shape of the first electrode unit 113. The auxiliary electrode finger 20 may include the first auxiliary electrode finger 21 extending toward the first electrode pad 112 and the second auxiliary electrode finger 22 extending in a direction different from a direction in which the first auxiliary electrode finger 21 extends.

Here, referring to FIG. 5, the first electrode unit 113 may have an intermediate electrode finger 30 extending between the first and second auxiliary electrode fingers 21 and 22. Thus, currents can be smoothly spread between the first electrode unit 113 and the first and second auxiliary electrode fingers 21 and 22, and smooth current spreading even in the central region of the light emitting structure S may also be guaranteed.

In this case, a distance d6 between the first auxiliary electrode finger 21 and the intermediate electrode finger 30 and a distance d6' between the second auxiliary electrode finger 22 and the intermediate electrode finger 30 may be different (d6≠d6' is satisfied). Namely, it may be understood that asymmetry between the first and second electrode fingers 111a and 111b and 121a and 121b may also be applied to the relationship between the first and second auxiliary electrode fingers 21 and 22 and the intermediate electrode finger 30. In this case, for example, a difference between the distances d6 and d6' may be within 50 μm.

In the case of an embodiment of the present inventive concept, the distance d6 between the intermediate electrode finger 30 and the first auxiliary electrode finger 21 adjacent to the upper region of the light emitting structure S in which the electrode pad is disposed to be relatively adjacent may be greater than the distance d6' between the second auxiliary electrode finger 22 and the intermediate electrode finger 30 (d6>d6'), but the present inventive concept is not limited thereto. According to an embodiment of the present inventive concept, currents can be advantageously evenly spread across the entire region of the light emitting structure S, rather than being concentrated to the periphery of the electrode pad.

Also, in order to allow currents to be widely distributed to the outer region of the light emitting structure S, rather than to be concentrated on the central region thereof, the distance d6 between the first auxiliary electrode finger 21 and the intermediate electrode finger 30 may be greater than the distances d3, d2, and d1 between electrode fingers formed in an outer region thereof (namely, d6>d3>d2>d1 may be satisfied).

Similarly, the distance d6' between the second auxiliary electrode finger 22 and the intermediate electrode finger 30 may be greater than the distances d3', d2', and d1' between the electrode fingers formed in an outer region thereof (d6'>d3'>d2'>d1' may be satisfied). According to an embodiment of the present inventive concept, currents can be widely spread across the entire region of the light emitting structure S, rather than being concentrated to a particular region, and luminance efficiency and operational voltage characteristics can be improved.

Figure 6:
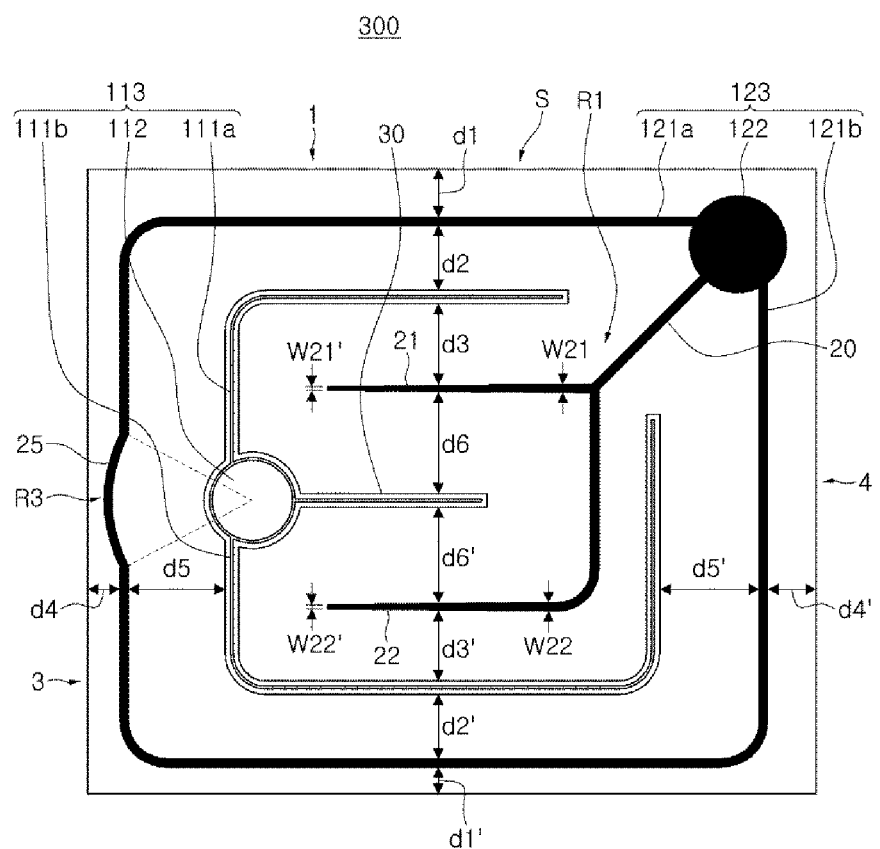

FIG. 6 is a schematic plan view of a semiconductor light emitting device 300 according to an embodiment of the present inventive concept. FIG. 6 illustrates a modification of FIG. 5.

Here, detailed descriptions of elements the same as those of the former embodiment will be omitted and different elements will be mainly described to clarify the gist of an embodiment of the present inventive concept.

Referring to FIG. 6, the semiconductor light emitting device 300 according to an embodiment of the present inventive concept may include the first and second electrode units 113 and 123. As illustrated, the second electrode unit 123 may have a closed loop shape, surrounding the first electrode unit 113.

Here, the second electrode unit 123 may surround the first electrode unit 113 in a modified shape in consideration of current concentration on the first electrode pad 112 provided in the first electrode unit 113.

Namely, among the first and second electrode unit 113 and 123, the electrode fingers of one of these substantially surrounding the other may cover the other electrode unit and protrude from a region adjacent to the electrode pad provided in the other electrode unit, having a convex shape. Here, the convex shape may correspond to the electrode pad provided in the other electrode unit. For example, referring to FIG. 6, the second electrode fingers 121a and 121b provided in the second electrode unit 123 may surround the first electrode unit 113 as a whole and have a convex portion 25 protruding from a region R3 of the second electrode fingers 121a and 121b, adjacent to the first electrode pad 112.

The convex portion 25 may have a shape corresponding to the shape of the first electrode pad 112, but the present inventive concept is not limited thereto. Also, as illustrated, the convex portion 25 may have an arc-like shape based on the center of the first electrode pad 112.

In an embodiment of the present inventive concept, the first and second auxiliary electrode fingers 21 and 22 provided in the second electrode unit 123 may extend with changing widths (W21 and W21', W22 and W22'). For example, the widths of the first and second auxiliary electrode fingers 21 and 22 may be decreased in a direction of the first and second auxiliary electrode fingers 21 and 22 away from the second electrode pad 122 (W21>W21', W22>W22' are satisfied).

Alternatively, the changing widths of the first and second auxiliary electrode fingers 21 and 22 may be determined in a relationship with the first electrode pad 112. For example, the widths of the first and second auxiliary electrode fingers 21 and 22 may be decreased in a direction toward the first electrode pad 112 (W21>W21', W22>W22' are satisfied).

In this case, by appropriately varying the widths of electrode fingers with respect to an electrode pad on which currents may be easily concentrated relatively, current concentration in a particular region can be prevented.

Hereinafter, a semiconductor light emitting device 400 according to a modification of the embodiment of FIG. 1 will be described with reference to FIGS. 7 through 9.

Figure 7:
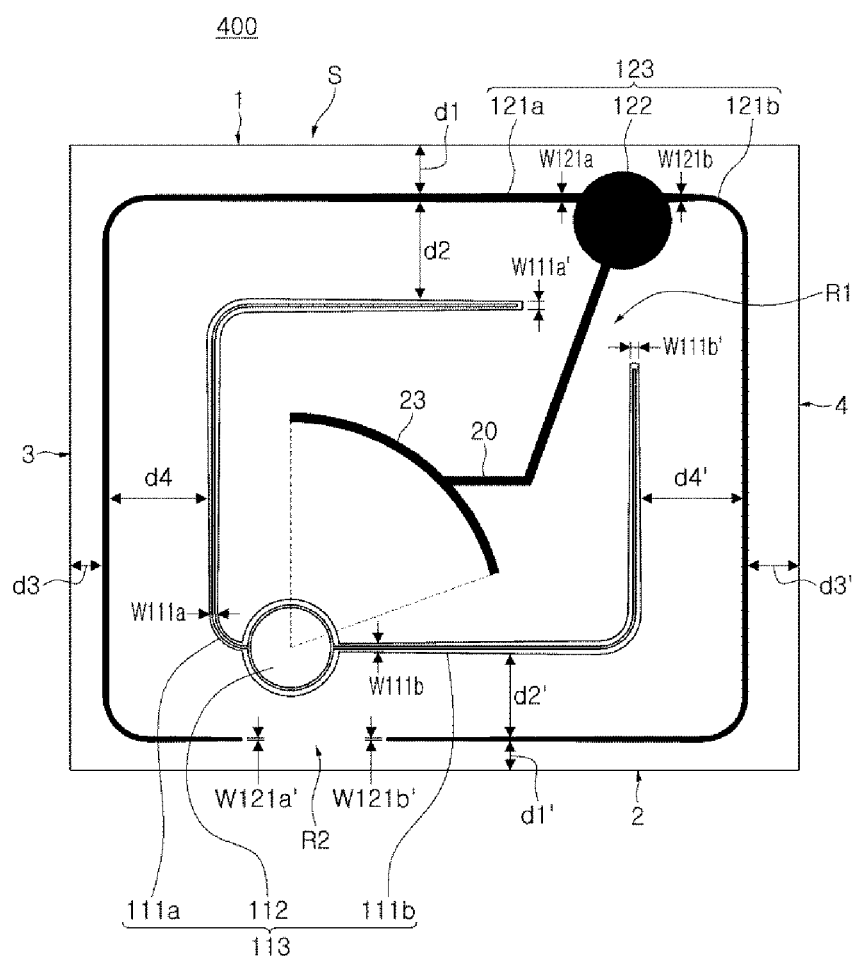
FIG. 7 is a schematic plan view of a semiconductor light emitting device according to an embodiment of the present inventive concept.
Figure 8:
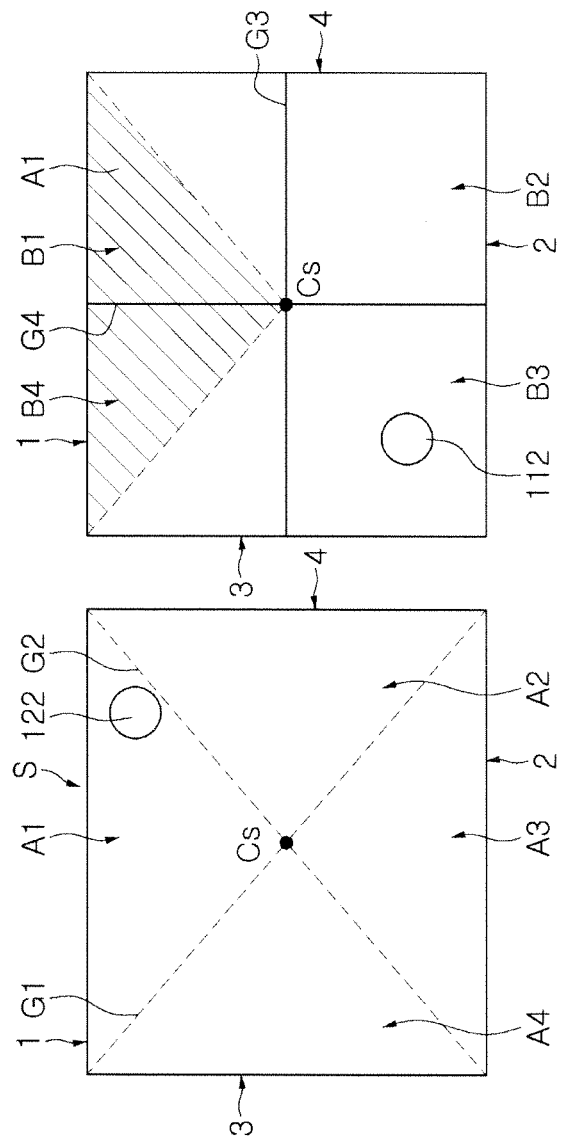
FIGS. 8A and 8B are plan views schematically illustrating only an upper surface of a light emitting structure and illustrating first and second electrode pads according to an embodiment of the present inventive concept, respectively.

FIG. 7 is a schematic plan view of a semiconductor light emitting device 400 according to an embodiment of the present inventive concept.

Referring to FIG. 7, the semiconductor light emitting device 400 according to an embodiment of the present inventive concept may include the light emitting structure S and the first and second electrode units 113 and 123. The light emitting structure S may include the first conductivity-type semiconductor layer 110, the active layer 130, and the second conductivity-type semiconductor layer 120. The first electrode unit 113 may be connected to the first conductivity-type semiconductor layer 110, and the second electrode unit 123 may be connected to the second conductivity-type semiconductor layer 120. The first electrode unit 113 may include the first electrode pad 112 and the first electrode fingers 111a and 111b. The second electrode unit 123 may include the second electrode pad 122 and the second electrode fingers 121a and 121b.

Hereinafter, detailed descriptions of elements the same as those of the above-described embodiments will be omitted to clarify the gist of an embodiment of the present inventive concept.

In an embodiment of the present inventive concept, the first and second electrode pads 112 and 122 may be asymmetrically disposed on the upper surface of the light emitting structure S. This will be described with reference to FIGS. 8A and 8B.

FIGS. 8A and 8B are plan views schematically illustrating only the upper surface of the light emitting structure and illustrating the first and second electrode pads 112 and 122 according to an embodiment of the present inventive concept, respectively.

Referring to FIGS. 8A and 8B, the first and second electrode pads 112 and 112 according to an embodiment of the present inventive concept may be asymmetrically disposed on the upper surface of the light emitting structure S, but the present inventive concept is not limited thereto.

For example, as illustrated in FIG. 8A, the second electrode pad 122 according to an embodiment of the present inventive concept may be disposed within a section A1 among first sections A1, A2, A3, and A4 divided by the different diagonal lines G1 and G2 linking vertices facing one another on the basis of the shape of the upper surface of the light emitting structure S.

Also, as illustrated in FIG. 8B, among second sections B1, B2, B3, and B4 divided by a horizontal line G3 and a vertical line G4 traversing the center Cs of the upper surface of the light emitting structure S on the basis of shape of the upper surface of the light emitting structure S, the first electrode pad 112 may be disposed in either of sections B2 and B3, excluding sections, e.g., B1 and B4, overlapping with the section A1 among the first sections in which the first electrode pad 112 is disposed. In FIG. 8B, it is illustrated that the first electrode pad 112 is disposed in the section B3 such that the first and second electrode pads 112 and 122 are spaced apart as much as possible, in consideration of the characteristics that currents are concentrated on the periphery of the electrode pads.

According to an embodiment of the present inventive concept, it is not necessary for the first and second electrode pads 112 and 122 to be disposed to be symmetrical to each other on the basis of the shape of the upper surface of the light emitting structures S, and thus, a degree of freedom in designing electrodes can be guaranteed and the operational voltage characteristics and smooth current spreading are induced to improve luminance efficiency.

Referring back to FIG. 7, similar to the embodiment illustrated in FIG. 1, the first and second electrode units 113 and 123 may have an annular shape with an open portion, and the second electrode unit 123 may be formed to substantially surround the first electrode unit 113.

In an embodiment of the present inventive concept, the opened region R1 of the annular shape of the first electrode unit 113 may be adjacent to the second electrode pad 122. Since currents may concentrate on the region adjacent to the electrode pad, it may be understood that the first electrode fingers 111a and 111b are not disposed in the region adjacent to the second electrode pad 122 for the purpose of spreading currents evenly.

The opened region R2 of the annular shape of the second electrode unit 123 may be a region farthest from the electrode pad (e.g., the second electrode pad 122) disposed in the same electrode unit as illustrated in FIG. 7.

In detail, the region R2 of the second electrode unit 123 having an opened annular shape may be symmetrical to the region in which the second electrode pad 122 is positioned with respect to the center of the annular shape of the second electrode unit 123. This is because, an effect of the second electrode fingers 121a and 121b contributing to current distribution is reduced away from the second electrode pad 122, and thus, the region R2 may be formed as being opened to thus prevent a degradation of luminance efficiency as otherwise the second electrode fingers 121a and 121b cover the upper surface of the light emitting structure S.

The second electrode unit 123 according to an embodiment of the present inventive concept may include an auxiliary electrode finger 20 extending in the opened region R1 of the annular shape of the first electrode unit 113. Here, the auxiliary electrode finger 20 may have a bent shape and may be disposed such that an end portion thereof faces the first electrode pad 112.

The auxiliary electrode finger 20 may further include a third auxiliary electrode finger 23. Here, the third auxiliary electrode finger 23 may be formed to be maintained at a predetermined or constant interval from the first electrode pad 112.

For example, the third auxiliary electrode finger 23 may include an arc-like shape on the basis of the center of the first electrode pad 112. In this case, since the electrode finger is maintained at a predetermined or constant interval from the electrode pad on which currents may be easily concentrated, concentration of currents on the particular region can be prevented and even current spreading can be promoted.

In an embodiment of the present inventive concept, widths (W111a and W111a', W111b and W111b', W121a and W121a', W121b and W121b') of the first and second electrode fingers 111a and 111b, 121a and 121b may be changed. For example, the widths of the first electrode fingers 111a and 111b may be decreased in a direction of the first electrode fingers 111a and 111b away from the first electrode pad 112 (W111a>W111a', W111b>W111b' are satisfied). Similarly, the widths of the second electrode fingers 121a and 121b may be decreased in a direction of the second electrode fingers 121a and 121b away from the second electrode pad 122 (W121a>W121a', W121b>W121b' are satisfied). In this manner, by appropriately varying the widths of the electrode fingers with respect to the electrode pad on which currents are relatively easily concentrated, current concentration on a particular region can be prevented.

According to an embodiment of the present inventive concept, by asymmetrically disposing the electrode pads and the electrode fingers as described above, both luminance efficiency and operational voltage characteristics of the semiconductor light emitting device can be improved.

Figure 9:
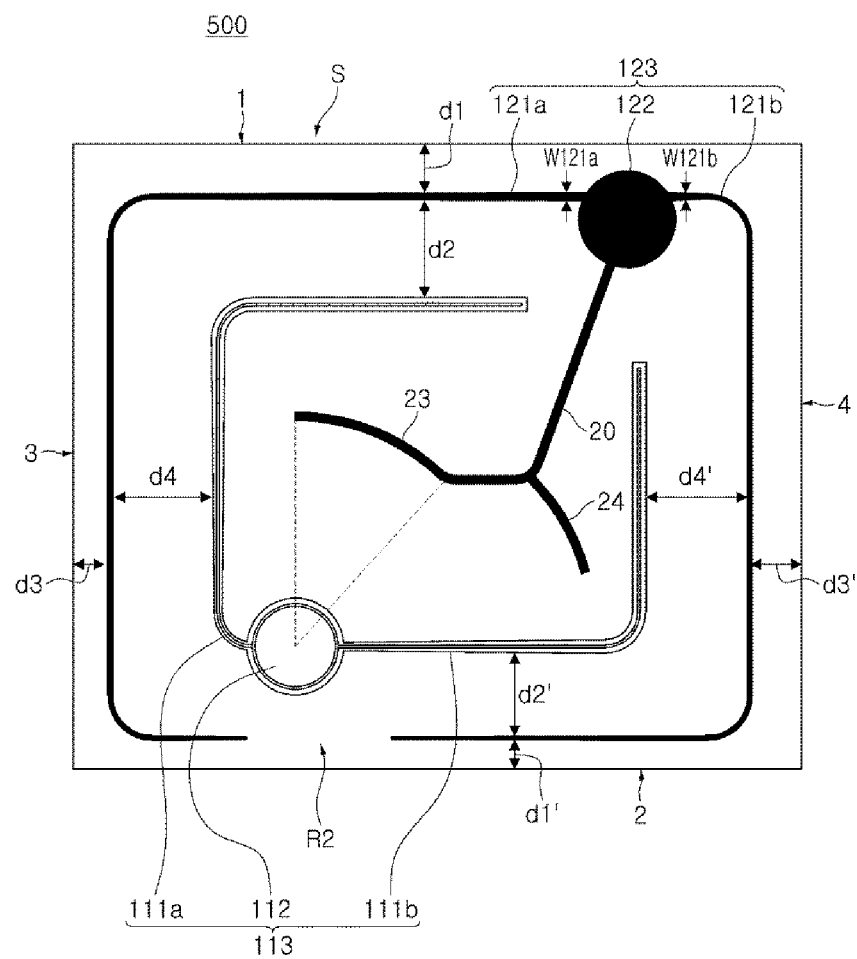
FIG. 9 is a schematic plan view of a semiconductor light emitting device according to an embodiment of the present inventive concept.

FIG. 9 is a schematic plan view of a semiconductor light emitting device 500 according to an embodiment of the present inventive concept.

The embodiment of FIG. 9 may be understood as a modification of the auxiliary electrode finger 20 of the embodiment of FIG. 7.

In detail, the second electrode unit 123 according to an embodiment of the present inventive concept may include the auxiliary electrode finger 20, and the auxiliary electrode finger 20 may include the third auxiliary electrode finger 23. As described in the above-described embodiments, the third auxiliary electrode finger 23 may be formed to be maintained at a predetermined or constant interval from the first electrode pad 112. For example, the third auxiliary electrode finger 23 may have an arc-like shape on the basis of the center of the first electrode pad 112.

In an embodiment of the present inventive concept, the auxiliary electrode finger 20 may further include a fourth auxiliary electrode finger 24 protruding in a direction different from that of the third auxiliary electrode finger 23. The fourth auxiliary electrode finger 24 may have an oval arc-like shape, and in this case, it is an oval arc-like shape curved concave toward the first electrode pad 112. The fourth auxiliary electrode finger 24 may be formed in a portion, in which a current density is low, in the internal region of the annular shape of the first electrode unit 113, to thus serve to complement more even current spreading in the central region of the light emitting structure S.

Figure 10A:
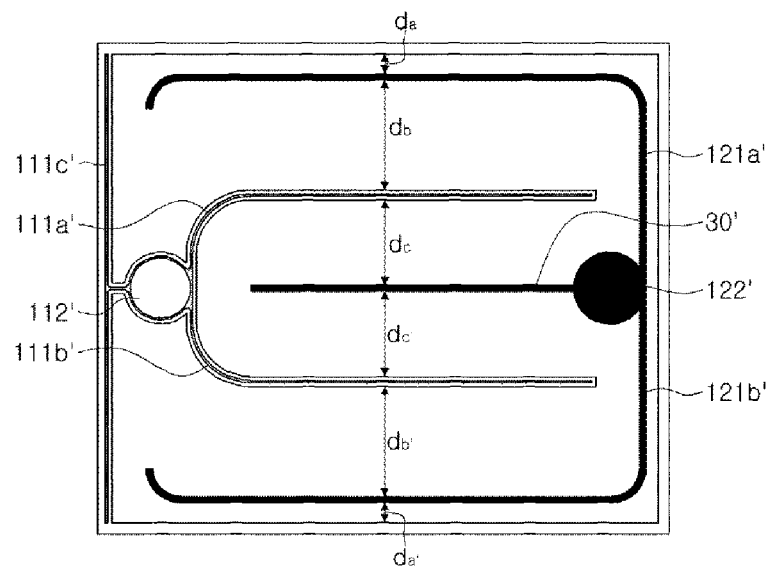
FIGS. 10A and 10B are plan views comparatively illustrating the characteristics of a semiconductor light emitting device according to an embodiment of the present inventive concept.
Figure 10B:
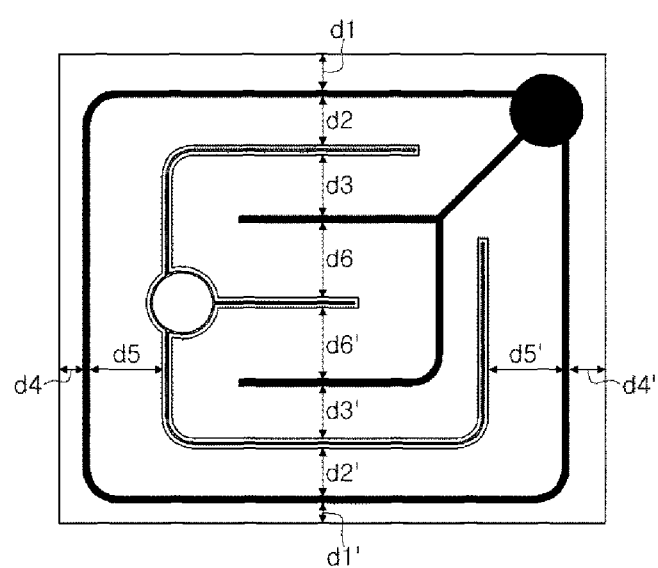

FIGS. 10A and 10B are plan views comparatively illustrating the characteristics of a semiconductor light emitting device according to an embodiment of the present inventive concept, respectively.

FIG. 10A is a schematic plan view of a semiconductor light emitting device proposed as a comparative example.

Referring to FIG. 10A, the semiconductor light emitting device according to the comparative example includes first and second electrode pads 112' and 122'. The first electrode pad 112' includes three first electrode fingers 111a', 111b', and 111c', and the second electrode pad 122' includes two second electrode fingers 121a' and 121b' and an intermediate electrode finger 30'.

In the case of the semiconductor light emitting device according to the comparative example of FIG. 10A, when a virtual extending line is drawn to the two second electrode fingers 121a' and 121b', the electrode finger 111c' extending from the first electrode pad 112' exists outside of a closed region defined by the second electrode fingers 121a' and 121b' and the extending line, and thus, the electrode structure of the comparative example does not correspond to a configuration in which one electrode unit substantially surrounds the other electrode unit.

Also, in the case of the semiconductor light emitting device according to the comparative example, the first and second electrode pads 112' and 122' are symmetrically disposed in ends of a horizontal line traversing the center of the upper surface of the light emitting structure, and the respective electrode fingers have symmetrical distances on the basis of the horizontal line (namely, $d_a=d_a'$, $d_b=d_b'$, and $d_c=d_c'$ are satisfied).

FIG. 10B is a schematic plan view of the semiconductor light emitting device proposed as an embodiment of the present inventive concept, which corresponds to a schematic plan view of the semiconductor light emitting device 200 according to the embodiment of FIG. 5. The semiconductor light emitting device 200 according to the embodiment of FIG. 10B satisfies asymmetry of electrode fingers as described above in the embodiment of FIG. 5 (namely, d1≠d1', d2≠d2', d3≠d3', d5≠d5', and d6≠d6' are satisfied, respectively).

Table 1 show operational voltage characteristics and optical power of the semiconductor light emitting devices according to the comparative example and the embodiment of FIG. 10B. Here, currents applied to the semiconductor light emitting devices according to the comparative example and the embodiment of FIG. 10B were 320 mA, respectively.

TABLE 1

|  | Comparative example | Embodiment |
| --- | --- | --- |
| Operational voltage (V) | 3.61 | 3.55 |
| Optical power (mW) | 367.7 | 370.9 |

Referring to Table 1, it can be seen that, in an embodiment of the present inventive concept, operational voltage was reduced, while optical power was increased.

Figure 11:
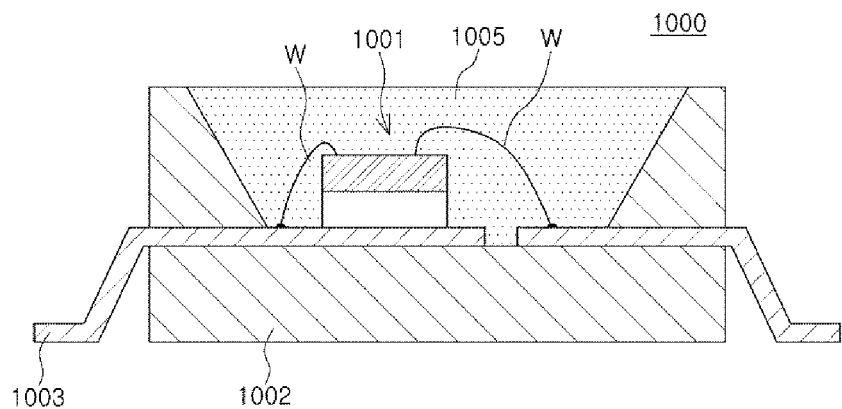
FIGS. 11 and 12 each are views illustrating an example in which a semiconductor light emitting device according to an embodiment of the present inventive concept is applied to a package.
Figure 12:
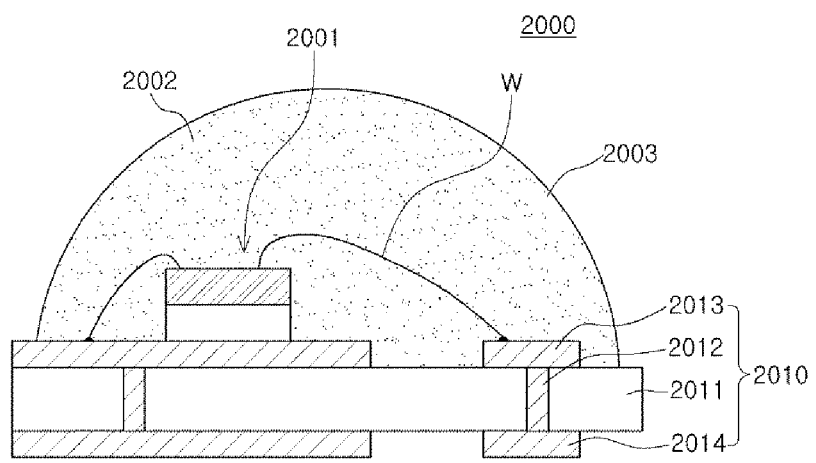

FIGS. 11 and 12 each are views illustrating an example in which a semiconductor light emitting device according to an embodiment of the present inventive concept is applied to a package.

Referring to FIG. 11, a semiconductor light emitting device package 1000 may include a semiconductor light emitting device 1001, a package body 1002, and a pair of lead frames 1003. The semiconductor light emitting device 1001 may be mounted on the lead frames 1003 and electrically connected to the lead frames 1003 through wires W. According to an embodiment of the present inventive concept, the semiconductor light emitting device 1001 may be mounted on a different region, rather than on the lead frames 1003, e.g., on the package body 1002. Also, the package body 1002 may have a cup-like shape to enhance light reflectivity efficiency, and an encapsulant 1005 formed of a light-transmissive material may be formed in the reflective cup to encapsulate the semiconductor light emitting device 1001, the wires W, and the like. In an embodiment of the present inventive concept, the semiconductor light emitting device package 1000 may include the semiconductor light emitting devices 100, 200, 300, 400, and 500 as described above.

Referring to FIG. 12, a semiconductor light emitting device package 2000 may include a semiconductor light emitting device 2001, a mounting substrate 2010, and an encapsulant 2003. Also, a wavelength conversion part 2002 may be formed on a surface and a lateral surface of the semiconductor light emitting device 2001. The semiconductor light emitting device 2001 may be mounted on the mounting substrate 2010 and may be electrically connected thereto through wires W.

The mounting substrate 2010 may include a substrate body 2011, an upper electrode 2013, and a lower electrode 2014. Also, the mounting substrate 2010 may include a through electrode 2012 connecting the upper electrode 2013 and the lower electrode 2014. The mounting substrate 2010 may be provided as a board such as printed circuit board (PCB), metal-core printed circuit board (MCPCB), multilayer printed circuit board (MPCB), flexible printed circuit board (FPCB), or the like. A structure of the mounting substrate 2010 may be variously applied.

The wavelength conversion part 2002 may include phosphors, quantum dots, and the like. The encapsulant 2003 may have a dome-shaped lens structure with a convex upper surface, but according to an embodiment of the present inventive concept, the wavelength conversion part 2002 may be formed to have a lens structure with a convex surface of concave surface to regulate an angle of illumination of light emitted through the upper surface of the encapsulant 2003.

In an embodiment of the present inventive concept, the semiconductor light emitting device package 2000 may include the semiconductor light emitting devices 100, 200, 300, 400, and 500 as described above.

Figure 13:
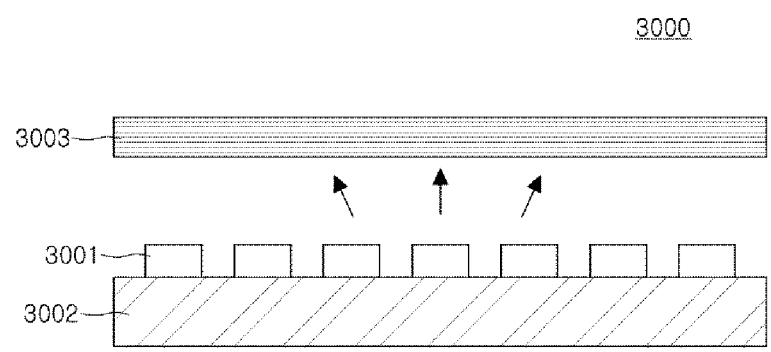
FIGS. 13 and 14 each are views illustrating an example in which a semiconductor light emitting device according to an embodiment of the present inventive concept is applied to a backlight unit.
Figure 14:
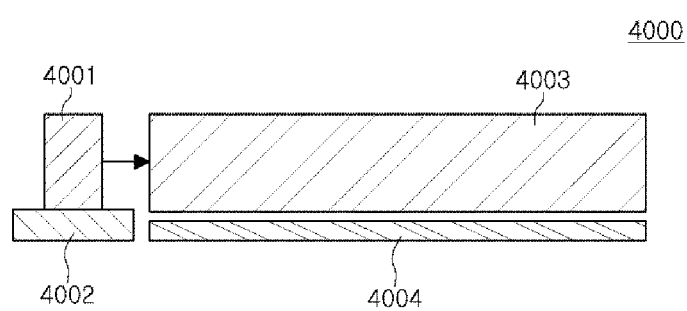

FIGS. 13 and 14 each are views illustrating an example in which a semiconductor light emitting device according to an embodiment of the present inventive concept is applied to a backlight unit.

Referring to FIG. 13, in a backlight unit 3000, semiconductor light emitting devices 3001 may be mounted on a substrate 3002, and one or more optical sheets 3003 may be disposed thereabove. For the semiconductor light emitting devices 3001, the semiconductor light emitting device package having the foregoing structure as described above with reference to FIGS. 11 and 12 or a structure similar thereto may be used. Also, the semiconductor light emitting devices 100, 200, 300, 400, and 500 as described above may be directly mounted on the substrate 3002 (a so-called COB type) so as to be used.

In the backlight unit 3000 illustrated in FIG. 13, the semiconductor light emitting devices 3001 may emit light toward an upper side where an LCD is disposed, but in comparison, in a backlight unit 4000 according to another example illustrated in FIG. 14, a semiconductor light emitting device 4001 mounted on a substrate 4002 may emit light in a lateral direction, and the emitted light may be made incident to a light guide plate 4003 so as to be changed into a surface light source. Light passing through the light guide plate 4003 may be emitted upwardly, and in order to enhance light extraction efficiency, a reflective layer 4004 may be disposed under the light guide plate 4003.

Figure 15:
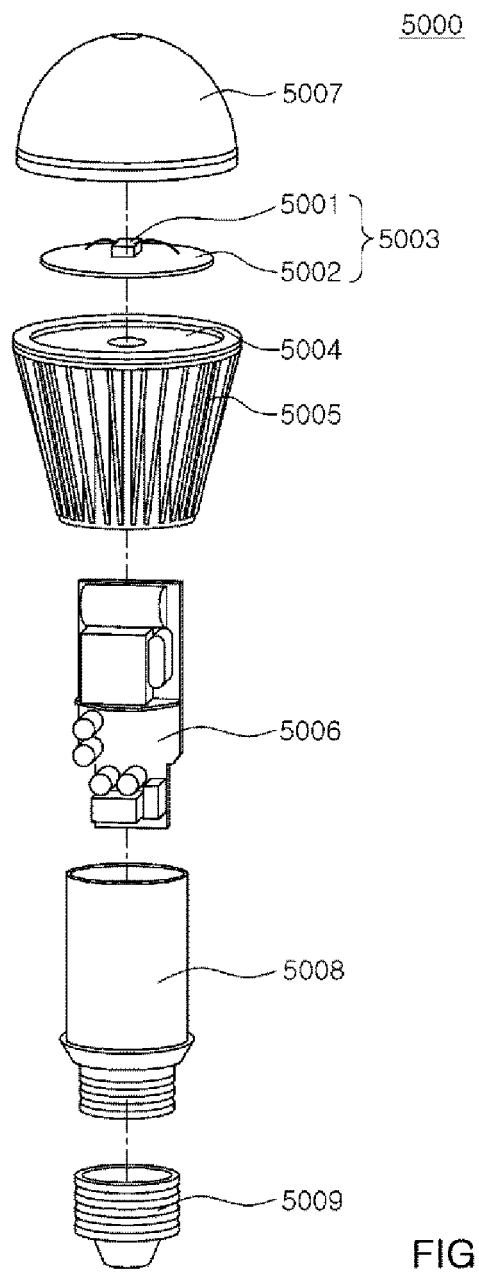
FIGS. 15 and 16 each are views illustrating an example in which a semiconductor light emitting device according to an embodiment of the present inventive concept is applied to a lighting device.
Figure 16:
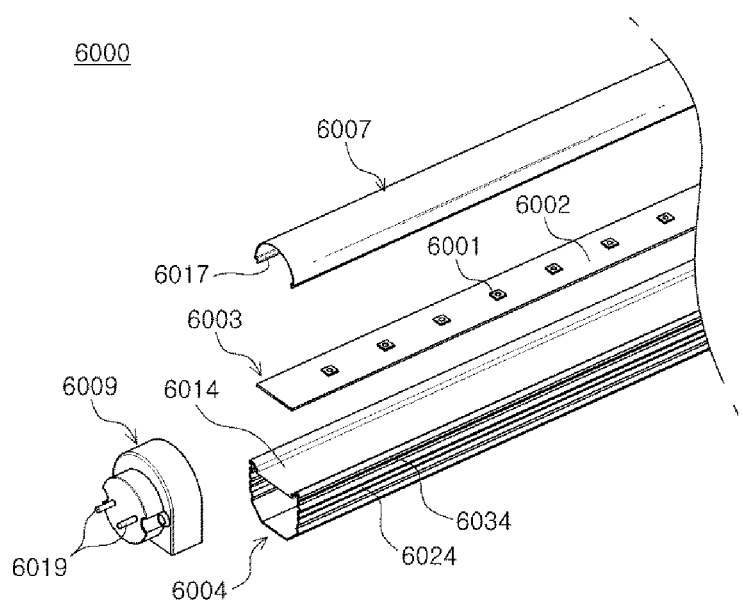

FIGS. 15 and 16 are exploded perspective views illustrating lighting devices 5000 and 6000 employing a semiconductor light emitting device according to an embodiment of the present inventive concept, respectively.

The lighting device 5000 may be a bulb-type lamp as illustrated in FIG. 15. The lighting device 5000 may have a shape similar to that of an incandescent bulb to replace a conventional incandescent bulb, and may emit light having optical characteristics (color, a color temperature, and the like) similar to those of an incandescent bulb, but the present inventive concept is not limited thereto.

Referring to the exploded perspective view of FIG. 15, the lighting device 5000 may include a light emitting module 5003, a driving unit 5006, and an external connection unit 5009. Also, the lighting device 5000 may further include external structures such as external and internal housings 5005 and 5008 and a cover unit 5007. The light emitting module 5003 may include a semiconductor light emitting device 5001 and a circuit board 5002 on which the semiconductor light emitting device 5001 is mounted. In an embodiment of the present inventive concept, a single semiconductor light emitting device 5001 may be mounted on the circuit board 5002, but the present inventive concept is not limited thereto and a plurality of semiconductor light emitting devices may be mounted as necessary. Here, the light emitting device 5001 may be the semiconductor light emitting devices 100, 200, 300, 400, and 500 as described above.

Also, in the lighting device 5000, the light emitting module 5003 may include an external housing 5005 serving as a heat dissipation unit, and the external housing 5005 may include a heat dissipation plate 5004 disposed to be in direct contact with the light emitting module 5003 to enhance a heat dissipation effect. Also, the lighting device 5000 may include a cover unit 5007 installed on the light emitting module 5003 and having a convex lens shape. The driving unit 5006 may be installed in the internal housing 5008 to receive power from an external connection unit 5009 having a socket structure. Also, the driving unit 5006 may serve to convert received power into an appropriate current source for driving the light source 5001 of the light emitting module 5003 and provide the same. For example, the driving unit 5006 may be configured to include a rectifying unit, a DC-DC converter, or the like.

The lighting device 6000 may be a bar-type lamp as illustrated in FIG. 16. The lighting device 6000 may have a shape similar to that of a fluorescent lamp to replace a conventional fluorescent lamp, and may emit light having optical characteristics (color, a color temperature, and the like) similar to those of a fluorescent lamp, but the present inventive concept is not limited thereto.

Referring to the exploded perspective view of FIG. 16, the lighting device 6000 according to an embodiment of the present inventive concept may include a light emitting module 6003, a body unit 6004, and a terminal unit 6009. The lighting device 6000 may further include a cover unit 6007 covering the light emitting module 6003.

The light emitting module 6003 may include a substrate 6002 and a plurality of light emitting devices 6001 mounted on the substrate 6002. The light emitting device 5001 may be the semiconductor light emitting devices 100, 200, 300, 400, and 500 as described above.

The body unit 6004 may allow the light emitting module 6003 to be fixed to one surface thereof. The body unit 6004, a type of support structure, may include a heat sink. The body unit 6004 may be formed of a material having excellent heat conductivity to dissipate heat generated by the light emitting module 6003 outwardly. For example, the body unit 6004 may be formed of a metal, but the present inventive concept is not limited thereto.

The body unit 6004 may have an elongated bar-like shape corresponding to the shape of the substrate 6002 of the light emitting module 6003 on the whole. The body unit 20 may have a recess 6014 formed in one surface thereof to accommodate the light emitting module 6003 therein.

A plurality of heat dissipation fins 6024 may protrude from both outer surfaces of the body unit 6004, for the purpose of heat dissipation. Stopping recesses 6034 may be formed in both ends of the outer surface positioned in an upper portion of the recess 6014, and extend in the length direction of the body unit 6004. The cover unit 6007 as described hereinafter may be fastened to the stopping recesses 6034.

Both end portions of the body unit 6004 in the length direction thereof may be open, so the body unit 6004 may have a pipe structure with both end portions thereof open. In the embodiment of FIG. 16, the body unit 6004 having both open end portions is illustrated, but the present inventive concept is not limited thereto. For example, only one of both end portions of the body unit 6004 may be open.

The terminal unit 6009 may be provided in at least one of the open both end portions of the body unit 6004 in the length direction to supply power to the light emitting module 6003. In an embodiment of the present inventive concept, both end portions of the body unit 6004 are open, so the terminal unit 6009 may be disposed in both end portions of the body unit 6004. However, the present inventive concept is not limited thereto and, when the body unit 6004 has a structure in which only one side thereof is open, the terminal unit 6009 may be provided in only the open end portion among both end portions of the body unit 6004.

The terminal unit 6009 may be fastened to both open end portions of the body unit 6004 to cover them. The terminal unit 6009 may include electrode pins 6019 protruding outwardly.

The cover unit 6007 may be fastened to the body unit 6004 to cover the light emitting module 6003. The cover unit 6007 may be formed of a material allowing light to be transmitted therethrough.

The cover unit 6007 may have a curved surface having a semicircular shape to allow light to be uniformly irradiated outwardly on the whole. A protrusion 6017 may be formed in a length direction of the cover unit 6007 on the bottom of the cover unit 6007 fastened to the body unit 6004, and engaged with the stopping recess 6034 of the body unit 6004.

In an embodiment of the present inventive concept, the cover unit 6007 may have a semicircular shape, but the present inventive concept is not limited thereto. For example, the cover unit 6007 may have a flat quadrangular shape or may have any other polygonal shape. The shape of the cover unit 6007 may be variously modified according to a design of illumination for irradiating light.

Figure 17:
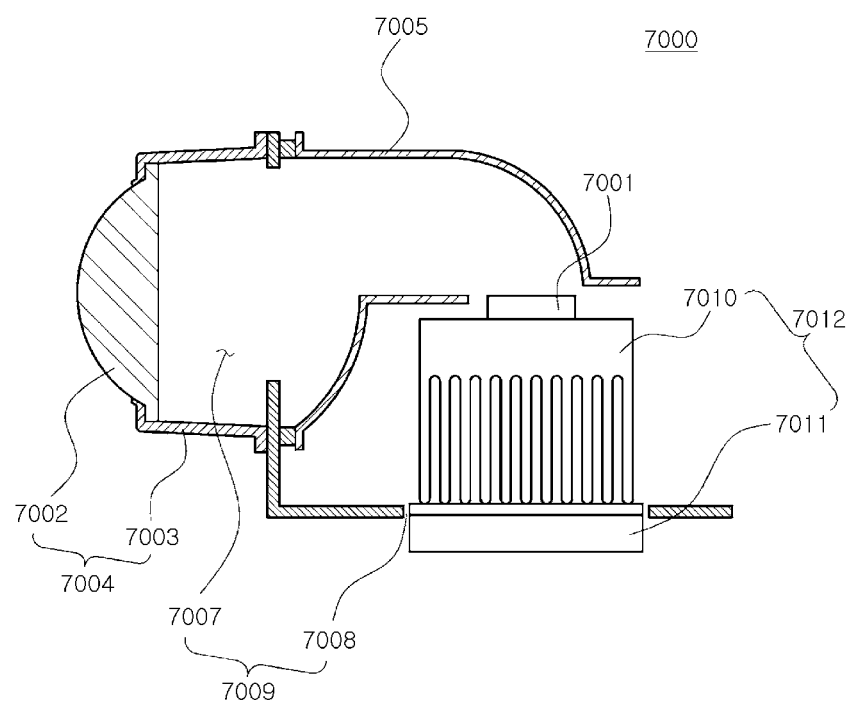
FIG. 17 is a view illustrating an example in which a semiconductor light emitting device according to an embodiment of the present inventive concept is applied to a head lamp.

FIG. 17 is a view illustrating an example in which a semiconductor light emitting device according to an embodiment of the present inventive concept is applied to a head lamp. Referring to FIG. 17, a head lamp 7000 used as a vehicle lamp, or the like, may include a light emitting device 7001, a reflective unit 7005, and a lens cover unit 7004. The lens cover unit 7004 may include a hollow guide 7003 and a lens 7002. Also, the head lamp 7000 may further include a heat dissipation unit 7012 dissipating heat generated by the light emitting device 7001 outwardly. In order to effectively dissipate heat, the heat dissipation unit 7012 may include a heat sink 7010 and a cooling fan 7011. Also, the head lamp 7000 may further include a housing 7009 fixedly supporting the heat dissipation unit 7012 and the reflective unit 7005, and the housing 7009 may have a central hole 7008 formed in one surface thereof, in which the heat dissipation unit 7012 is coupled. Also, the housing 7009 may have a front hole 7007 formed on the other surface integrally connected to the one surface and bent in a right angle direction. The front hole 7007 may allow the reflective unit 7005 to be fixedly positioned above the light emitting device 7001. Accordingly, a front side may be opened by the reflective unit 7005, and the reflective unit 7005 may be fixed to the housing 7009 such that the opened front side corresponds to the front hole 7007, and light reflected by the reflective unit 7005 may pass through the front hole 7007 so as to be output outwardly.

As set forth above, according to embodiments of the present inventive concept, by having the improved electrode structure, the semiconductor light emitting device having improved luminance efficiency and operational voltage characteristics can be obtained.

Advantages and effects of the present inventive concept are not limited to the foregoing content and any other technical effects not mentioned herein may be easily understood by a person skilled in the art from the foregoing description.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device, comprising:
   a light emitting structure including a first conductivity-type semiconductor layer, an active layer, and a second conductivity-type semiconductor layer;
   a first electrode unit disposed on an upper surface of the light emitting structure, connected to the first conductivity-type semiconductor layer, including a first electrode pad and a first electrode finger extending from the first electrode pad, and having an annular shape with an open portion; and
   a second electrode unit disposed on the upper surface of the light emitting structure, connected to the second conductivity-type semiconductor layer, including a second electrode pad and a second electrode finger extending from the second electrode pad, and having an annular shape with an open portion,
   wherein one of the first and second electrode units substantially surrounds the other of the first and second electrode units, and
   a center of the annular shape of at least one of the first and second electrode units is spaced apart from the center of the upper surface of the light emitting structure.

2. The semiconductor light emitting device of claim 1, wherein at least one of the annular shapes of the first and second electrode units corresponds to the shape of the upper surface of light emitting structure.

3. The semiconductor light emitting device of claim 1, wherein the center of the annular shape of a particular one of the first and second electrode units is spaced apart from the center of the upper surface of the light emitting structure in a direction of the electrode pad provided in the particular electrode unit being spaced apart from a vertex of the upper surface of the light emitting structure adjacent thereto.

4. The semiconductor light emitting device of claim 1, wherein:
   the first electrode pad is disposed in one of first sections divided by different diagonal lines linking vertices facing one another on the basis of the shape of the upper surface of the light emitting structure, and
   the second electrode pad is disposed in a section among second sections, which does not overlap with the one first section, the second sections being divided by a horizontal line and a vertical line traversing the center of the upper surface of the light emitting structure on the basis of the upper surface of the light emitting structure.

5. The semiconductor light emitting device of claim 1, wherein on the basis of the shape of the upper surface of the light emitting structure, a distance between one side of the upper surface and an annular shape adjacent thereto and a distance between a side opposing the one side and the annular shape adjacent thereto are different from each other.

6. The semiconductor light emitting device of claim 1, wherein the center of the annular shape of the first electrode unit is spaced apart from the center of the annular shape of the second electrode unit.

7. The semiconductor light emitting device of claim 1, wherein a distance between one side of the annular shape of the one electrode unit substantially surrounding the other electrode unit, among the first and second electrode units, and one side of the annular shape of the other electrode unit adjacent thereto, is different from a distance between another side opposing the one side of the annular shape of the one electrode unit and another side of the annular shape of the other electrode unit adjacent thereto.

8. The semiconductor light emitting device of claim 1, wherein at least one of the first and second electrode fingers extends to the opened region of the annular shape to make the annular shape a closed loop.

9. The semiconductor light emitting device of claim 1, wherein the one electrode unit substantially surrounding the other electrode unit, among the first and second electrode units, further comprises an auxiliary electrode finger extending through the opened region of the annular shape of the other electrode unit.

10. The semiconductor light emitting device of claim 9, wherein the auxiliary electrode finger comprises a first auxiliary electrode finger extending toward the electrode pad provided in the other electrode unit.

11. The semiconductor light emitting device of claim 10, wherein the auxiliary electrode finger further comprises a second auxiliary electrode finger extending in a direction different from the direction in which the first auxiliary electrode finger extends.

12. The semiconductor light emitting device of claim 11, wherein a distance between one side of the annular shape of the other electrode unit and the first auxiliary electrode finger and a distance between the other side opposing the one side of the annular shape of the other electrode unit and the second auxiliary electrode finger are different from each other.

13. The semiconductor light emitting device of claim 11, wherein the other electrode unit further comprises an intermediate electrode finger extending between the first and second auxiliary electrode fingers.

14. The semiconductor light emitting device of claim 13, wherein a distance between the first auxiliary electrode finger and the intermediate electrode finger and a distance between the second auxiliary electrode finger and the intermediate electrode finger are different from each other.

15. A semiconductor light emitting device, comprising:
    a light emitting structure including a first conductivity-type semiconductor layer, an active layer, and a second conductivity-type semiconductor layer, and having an upper surface with first to fourth sides;
    a first electrode unit disposed on an upper surface of the light emitting structure, connected to the first conductivity-type semiconductor layer, and including a first electrode pad and a first electrode finger extending from the first electrode pad; and
    a second electrode unit disposed on the upper surface of the light emitting structure, connected to the second conductivity-type semiconductor layer, and including a second electrode pad and a second electrode finger extending from the second electrode pad,
    wherein the first and second electrode units have an annular shape with an open portion, one of the first and second electrode units substantially surrounds the other of the first and second electrode units, and a distance between a first side of the upper surface of the light emitting structure and an annular shape adjacent thereto and a distance between a second side opposing the first side and an annular shape adjacent thereto are different.

16. A semiconductor light emitting device, comprising:
a light emitting structure including a first conductivity-type semiconductor layer, an active layer, and a second conductivity-type semiconductor layer;
a first electrode unit disposed on an upper surface of the light emitting structure, connected to the first conductivity-type semiconductor layer, including a first electrode pad and a first electrode finger extending from the first electrode pad, and having an annular shape with an open portion; and
a second electrode unit disposed on the upper surface of the light emitting structure, connected to the second conductivity-type semiconductor layer, including a second electrode pad and a second electrode finger extending from the second electrode pad, and having an annular shape that has a closed loop,
wherein the second electrode units substantially surrounds the first electrode unit, and
a center of the annular shape of at least one of the first and second electrode units is spaced apart from the center of the upper surface of the light emitting structure.

17. The semiconductor light emitting device of claim 16, wherein the second electrode unit further comprises an auxiliary electrode finger extending through the opened region of the annular shape of the first electrode unit.

18. The semiconductor light emitting device of claim 17, wherein the auxiliary electrode finger comprises a first auxiliary electrode finger extending toward the electrode pad provided in the first electrode unit.

19. The semiconductor light emitting device of claim 18, wherein the auxiliary electrode finger further comprises a second auxiliary electrode finger extending in a direction different from the direction in which the first auxiliary electrode finger extends.

20. The semiconductor light emitting device of claim 19, wherein the first electrode unit further comprises an intermediate electrode finger extending between the first and second auxiliary electrode fingers.

\* \* \* \* \*